(12) United States Patent
DiFonzo et al.

(10) Patent No.: US 7,911,771 B2
(45) Date of Patent: Mar. 22, 2011

(54) ELECTRONIC DEVICE WITH A METAL-CERAMIC COMPOSITE COMPONENT

(75) Inventors: John DiFonzo, San Mateo, CA (US); Chris Ligtenberg, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 772 days.

(21) Appl. No.: 11/752,850

(22) Filed: May 23, 2007

(65) Prior Publication Data
US 2008/0291617 A1    Nov. 27, 2008

(51) Int. Cl.
*H05K 5/00* (2006.01)
*B22F 3/00* (2006.01)

(52) U.S. Cl. .................. 361/679.01; 428/545
(58) Field of Classification Search .......... 361/679.01; 428/545
See application file for complete search history.

(56) References Cited

U.S. PATENT DOCUMENTS

| | | | |
|---|---|---|---|
| D264,969 S | 6/1982 | McGourty | |
| 4,976,435 A | 12/1990 | Shatford et al. | |
| 5,066,368 A * | 11/1991 | Pasqualoni et al. | 205/112 |
| 5,192,082 A | 3/1993 | Inoue et al. | |
| 5,379,057 A | 1/1995 | Clough | |
| 5,661,632 A | 8/1997 | Register | |
| 5,675,362 A | 10/1997 | Clough | |
| 5,917,545 A | 6/1999 | Kowno et al. | |
| D412,940 S | 8/1999 | Kato et al. | |
| 5,964,661 A | 10/1999 | Dodge | |
| 6,058,356 A | 5/2000 | Swanson | |
| D430,169 S | 8/2000 | Scibora | |
| 6,122,526 A | 9/2000 | Parulski et al. | |
| D432,523 S | 10/2000 | Grinkus et al. | |
| 6,127,986 A | 10/2000 | Wen et al. | |
| 6,178,094 B1 | 1/2001 | Hakozaki | |
| D437,860 S | 2/2001 | Suzuki et al. | |
| 6,220,680 B1 | 4/2001 | Chen | |
| 6,227,966 B1 | 5/2001 | Yokoi | |
| 6,249,427 B1 | 6/2001 | Carroll | |
| 6,254,477 B1 | 7/2001 | Sasaki et al. | |
| 6,262,785 B1 | 7/2001 | Kim | |
| 6,292,556 B1 | 9/2001 | Laetsch | |
| D448,810 S | 10/2001 | Goto | |
| D450,713 S | 11/2001 | Masamitsu et al. | |
| 6,314,483 B1 | 11/2001 | Goto et al. | |
| 6,319,631 B1 | 11/2001 | Bay et al. | |
| D452,250 S | 12/2001 | Chan | |
| 6,351,374 B1 | 2/2002 | Sherry | |
| D455,793 S | 4/2002 | Lin | |
| 6,449,164 B1 | 9/2002 | Gershfeld | |
| D468,365 S | 1/2003 | Bransky et al. | |
| D469,109 S | 1/2003 | Andre et al. | |
| D472,245 S | 3/2003 | Andre et al. | |
| 6,643,918 B2 | 11/2003 | Ortiz et al. | |
| D483,809 S | 12/2003 | Lim | |

(Continued)

OTHER PUBLICATIONS

U.S. Appl. No. 12/034,104, filed Feb. 20, 2008.

(Continued)

*Primary Examiner* — Jayprakash N Gandhi
*Assistant Examiner* — Anthony M Haughton
(74) *Attorney, Agent, or Firm* — Beyer Law Group LLP

(57) ABSTRACT

An electronic device is disclosed. The electronic device may include a first component. The electronic device may also include a metal-ceramic composite component coupled to the first component and configured to reinforce at least a portion of the first component in a first direction.

18 Claims, 2 Drawing Sheets

U.S. PATENT DOCUMENTS

| | | | |
|---|---|---|---|
| 6,693,601 | B2 | 2/2004 | Billiet et al. |
| D489,731 | S | 5/2004 | Huang |
| D490,068 | S | 5/2004 | Chen |
| 6,790,556 | B1 | 9/2004 | Meitav et al. |
| 6,795,715 | B1 | 9/2004 | Kubo et al. |
| D497,618 | S | 10/2004 | Andre et al. |
| 6,837,435 | B2 | 1/2005 | Kehoe et al. |
| 6,840,311 | B2 | 1/2005 | Ghosh et al. |
| D506,476 | S | 6/2005 | Andre et al. |
| D515,545 | S | 2/2006 | Griffin |
| 6,995,715 | B2 | 2/2006 | Ying et al. |
| D516,579 | S | 3/2006 | Nakamura |
| 7,013,164 | B2 | 3/2006 | Lin |
| D521,023 | S | 5/2006 | Kim et al. |
| 7,046,230 | B2 | 5/2006 | Zadesky et al. |
| 7,070,881 | B2 | 7/2006 | Kishiyama et al. |
| 7,188,484 | B2 | 3/2007 | Kim |
| 7,203,309 | B2 | 4/2007 | Nuovo |
| 7,495,659 | B2 | 2/2009 | Marriott et al. |
| 2001/0034222 | A1 | 10/2001 | Roustaei et al. |
| 2001/0053464 | A1 | 12/2001 | Ra |
| 2002/0195562 | A1 | 12/2002 | Salapow et al. |
| 2003/0100275 | A1 | 5/2003 | Hsu et al. |
| 2003/0183448 | A1* | 10/2003 | Sleet et al. .................. 181/293 |
| 2004/0053014 | A1 | 3/2004 | Sato |
| 2004/0102229 | A1 | 5/2004 | Hutchinson |
| 2004/0196607 | A1 | 10/2004 | Didier |
| 2004/0224638 | A1 | 11/2004 | Fadell et al. |
| 2005/0052425 | A1 | 3/2005 | Zadesky et al. |
| 2008/0059680 | A1 | 3/2008 | Hiew et al. |
| 2008/0074329 | A1 | 3/2008 | Caballero et al. |
| 2008/0165071 | A1 | 7/2008 | Chiang et al. |
| 2008/0291620 | A1 | 11/2008 | DiFonzo et al. |
| 2009/0040129 | A1 | 2/2009 | Degner et al. |

OTHER PUBLICATIONS

Office Action dated Oct. 18, 2010 in U.S. Appl. No. 12/685,463.
Notice of Allowance dated Jul. 28, 2010 in U.S. Appl. No. 12/412,108.
Office Action dated Apr. 12, 2010 in U.S. Appl. No. 12/412,108.
Notice of Allowance dated Jan. 15, 2010 in U.S. Appl. No. 11/501,184.
Notice of Allowance dated Sep. 8, 2009 in U.S. Appl. No. 12/395,570.
Office Action dated Aug. 17, 2009 in U.S. Appl. No. 11/501,184.
"Maxtor OneTouch II FireWire and USB", Maxtor.com, http://www.maxtor.com/portal/site/Maxtor/menuitem.ba88f6d7cf664718376049b2913460... downloaded Dec. 1, 2004.
"Maxtor OneTouch USB OneTouch Family", Maxtor.com, http://www.maxtor.com/portal/site/Maxtor/menuitem.ba88f6d7cf664718376049b2913460... downloaded Dec. 1, 2004.
CoolerMaster Wave Master Black Aluminum Case Review:, PCStats.com, http://www.pcstats.com/articleview.cfm?articleID=1552, Dowloaded Dec. 1, 2004.
Office Action mailed Nov. 16, 2005 from U.S. Appl. No. 10/884,172.
Final Office Action mailed May 4, 2006 from U.S. Appl. No. 10/884,172.
Office Action mailed Jul. 27, 2007 from U.S. Appl. No. 10/884,172.
Final Office Action mailed Dec. 28, 2007 from U.S. Appl. No. 10/884,172.
Office Action mailed Aug. 6, 2008 from U.S. Appl. No. 10/884,172.
Notice of Allowance mailed Dec. 1, 2008 from U.S. Appl. No. 10/884,172.
Supplemental Notice of Allowability mailed Feb. 4, 2009 from U.S. Appl. No. 10/884,172.
U.S. Appl. No. 29/196,832, filed Jan. 5, 2004.
Andre et al., entitled "Media Device," Design U.S. Appl. No. 29/180,558, filed Apr. 25, 2003.
Zadesky et al., "Movable touch pad with added functionality," U.S. Appl. No. 10/643,256, filed Aug. 18, 2003.
Andre et al., "Media Device," Design U.S. Appl. No. 29/212,343, filed Aug. 31, 2004.
Office Action mailed Feb. 26, 2009 from U.S. Appl. No. 11/501,184.

* cited by examiner

ELECTRONIC DEVICE WITH A METAL-CERAMIC COMPOSITE COMPONENT

BACKGROUND OF THE INVENTION

For electronic devices, miniaturization and weight reduction may provide significant advantages such as, for example, improved portability and/or reduced costs for storage, packaging, and/or transportation. However, miniaturization and weight reduction of electronic devices may be hindered by various physical constraints (e.g., physical properties of structural component/enclosure materials) due to various design requirements (e.g., strength and durability requirements of the electronic devices).

In addition to functionality, performance, and durability requirements, aesthetic and tactile characteristics of electronic devices also have become more and more important. For example, buyers/users may expect surfaces (e.g., enclosure surfaces) of electronic devices to be scratch and dent resistant. Further, buyers/users may also expect electronic devices to look good and to have a comfortable, quality feel.

In the prior art, designers of electronic devices may have had difficulties designing electronic device components with the right materials to enable/help electronic devices to satisfy all the strength, weight, size, aesthetic/cosmetic, and tactile requirements and expectations with a generally affordable cost.

For example, materials typically utilized in structural components and/or enclosures of electronic devices may include plastics, such as polycarbonate, nylon, and ABS, which may be associated with lower cost, lighter weight, and a higher variety of visual characteristics (e.g., colors, patterns, etc.), compared with the cost, weight, and appearance of a metal. However, a plastic component may need a relatively large dimension (e.g., thickness) to provide sufficient strength. Further, a plastic component may not be able to satisfactorily resist scratch.

Metals, such as steel, titanium, aluminum, and magnesium, also may be utilized in forming structural components and/or enclosures of electronic devices. Metals may provider higher strength and higher scratch resistance than plastics. However, metals may incur higher material and manufacturing costs. Metals may also significantly add weight to electronic devices. Light metals, such as titanium, aluminum, etc., may be utilized to minimize the weight problem. However, light metals may have a high cost and/or may need an undesirably large dimension to provide sufficient dent resistance and strength, as further discussed with reference to FIG. 1.

FIG. 1 illustrates a partial cross-sectional view of an example prior-art electronic device 100. As illustrated in the example of FIG. 1, electronic device 100 may include an enclosure 110 and a disk drive bezel 120 disposed inside enclosure 110. When a user of electronic device 100 loads optical disks through disk drive bezel 120, a force may be applied to enclosure 110 in a first direction 101, for example, by one or more fingers of the user. The force may then be transmitted to disk drive bezel 120. Enclosure 110 may rely on the support of disk drive bezel 120 to withstand the force, to ensure that enclosure 110 may not be deformed or damaged by the force.

Disk drive bezel 120 may be made of aluminum, a relatively inexpensive light metal, for minimizing the weight of electronic device 300 without incurring a high material cost (associated with employing titanium, for example). In order to provide sufficient strength to support enclosure 110 and to prevent deformation and damage, disk drive bezel 120 may need to have dimensions that are sufficiently large. For example, disk drive bezel 120 may be required to have a sufficiently large thickness T1, along first direction 101. The requirement of thickness T1 may be associated with the amount of aluminum, which contributes to the weight of electronic device 100. The requirement of thickness T1 may also be associated with utilization of space, which is to be shared by various components inside electronic device 100. As a result, the requirement of thickness T1 may hinder the miniaturization and weight reduction of electronic device 100.

SUMMARY OF INVENTION

An embodiment of the present invention relates to an electronic device. The electronic device may include a first component. The electronic device may also include a metal-ceramic composite component coupled to the first component and configured to reinforce at least a portion of the first component in a first direction.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
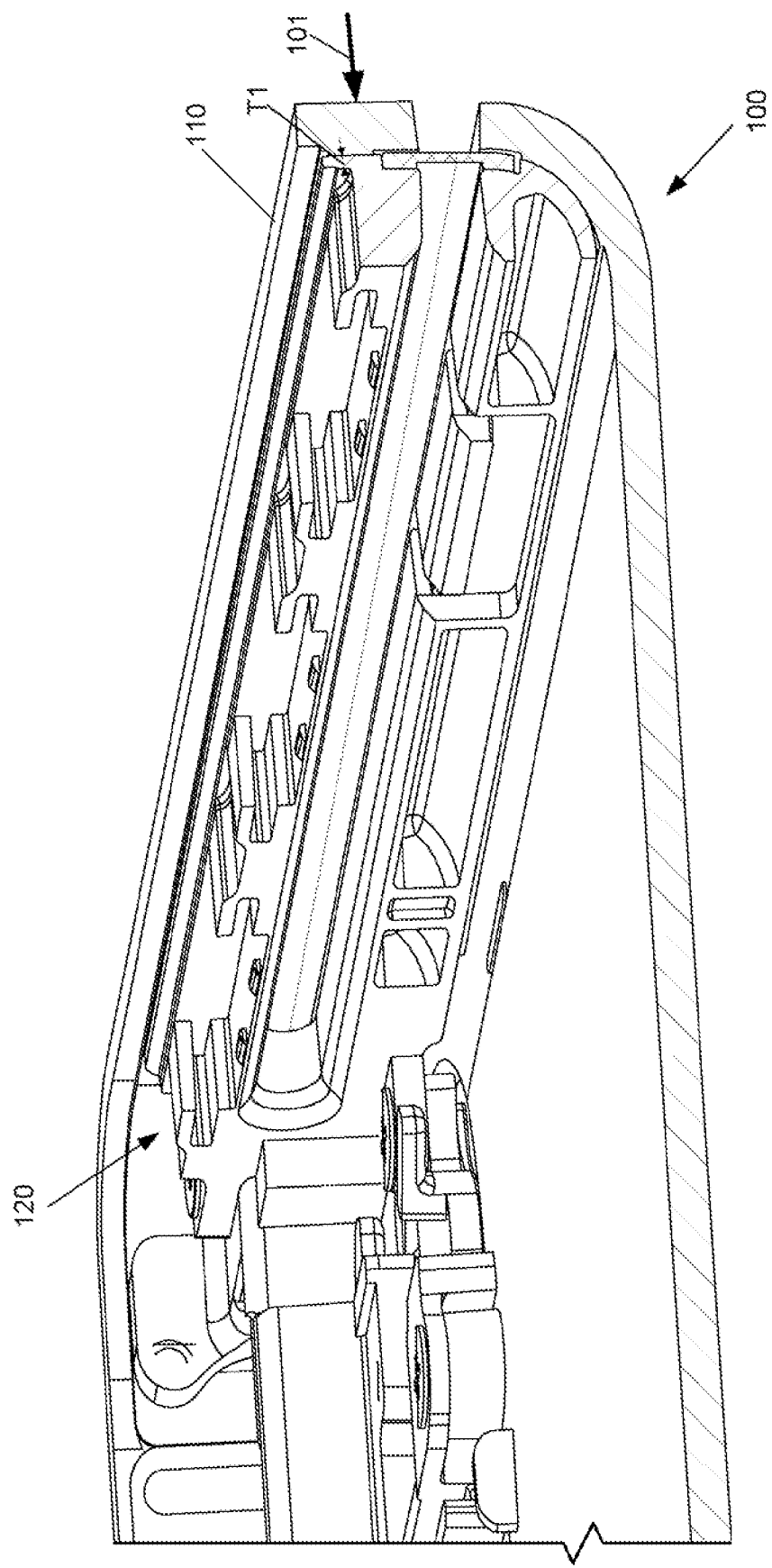
FIG. 1 illustrates a partial cross-sectional view of an example prior-art electronic device.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

One or more embodiments of the invention relate to an electronic device. For example, the electronic device may represent one or more of a computing device (e.g., a computer), a computer part (e.g., a disk drive), a communication device (e.g., a cellular phone), a media player (e.g., an MP3 player), etc.

The electronic device may include a first component, for example, an enclosure (or case). The electronic device may also include a metal-ceramic composite component coupled to the first component and configured to reinforce at least a portion of the first component in a first direction, e.g., a direction in which the electronic device may be frequently applied a force or pressure. The metal-ceramic composite component may have a greater strength in the first direction than in a second direction.

The metal-ceramic composite component may be made of a metal-ceramic composite material containing at least one of aluminum, magnesium, titanium, zirconia, and alumina. Additionally or alternatively, the metal-ceramic composite component may be made of a metal-ceramic matrix composite material. The metal-ceramic composite component may have a metal surface. At least a surface of the metal-ceramic composite component may be colored through anodization. Additionally or alternatively, at least a surface of the metal-ceramic composite may be painted and/or coated such that the metal-ceramic composite component also serves as a cosmetic and/or tactile member for the electronic device, in addition to being a structural member. Accordingly, no additional cover member is needed for the metal-ceramic composite component. Advantageously, the number of cosmetic/tactile members for the electronic device may be reduced, and the size (or form factor) of the electronic device may be reduced or minimized.

The metal-ceramic composite component may be configured to provide an opening for receiving an object (e.g., an optical disk, a memory card, or a connector) that is inserted into the electronic device. The object may be inserted into the electronic device in the first direction. For example, the metal-ceramic composite component may represent at least part of one of a disk drive bezel (e.g., an optical disk drive bezel), a memory card bezel, a connector, etc. The metal-ceramic composite component may also represent at least part of a user interface component, such as one or more of a coin turn, a track pad, and a button.

The metal-ceramic composite component may include a feature formed though casting, such as mold casting and configured to match at least a portion of a second component of the electronic device. For example, the second component may represent a shutter/curtain through which a storage medium (e.g., an optical disk or a memory card) may enter and exit the electronic device. Alternatively or additionally, at least a portion of the second component may be inserted between at least a portion of the metal-ceramic composite component and at least a portion of the first component.

The electronic device may further include a structural component coupled to the metal-ceramic composite component. The metal-ceramic composite component may be disposed between at least a portion of the structural component and at least a portion of the first component. The metal-ceramic composite component may be bonded to the structural component by an adhesive, such as DP810 available from 3M Company (www.3m.com).

The structural component also may include an opening configured to receive an object that is inserted into the electronic device in the first direction. For example, the structural component also may represent at least part of one of a disk drive bezel (e.g., an optical disk drive bezel), a memory card bezel, a connector, etc.

One or more embodiments of the present invention relate to a structural component configured for use in an electronic device. For example, the structural component may represent one of a disk drive bezel (e.g., an optical disk drive bezel), a memory card bezel, a connector, etc. The structural component may include a first part is made of a metal-ceramic composite material and configured to reinforce the electronic device in a first direction. The structural component may include an opening configured to receive an object that is inserted into the electronic device in the first direction. The first part may be further configured to secure a member (e.g., a flexible component) of the electronic device in place with respect to an enclosure of the electronic device.

The features and advantages of the present invention may be better understood with reference to the figure and discussions that follow.

Figure 2:
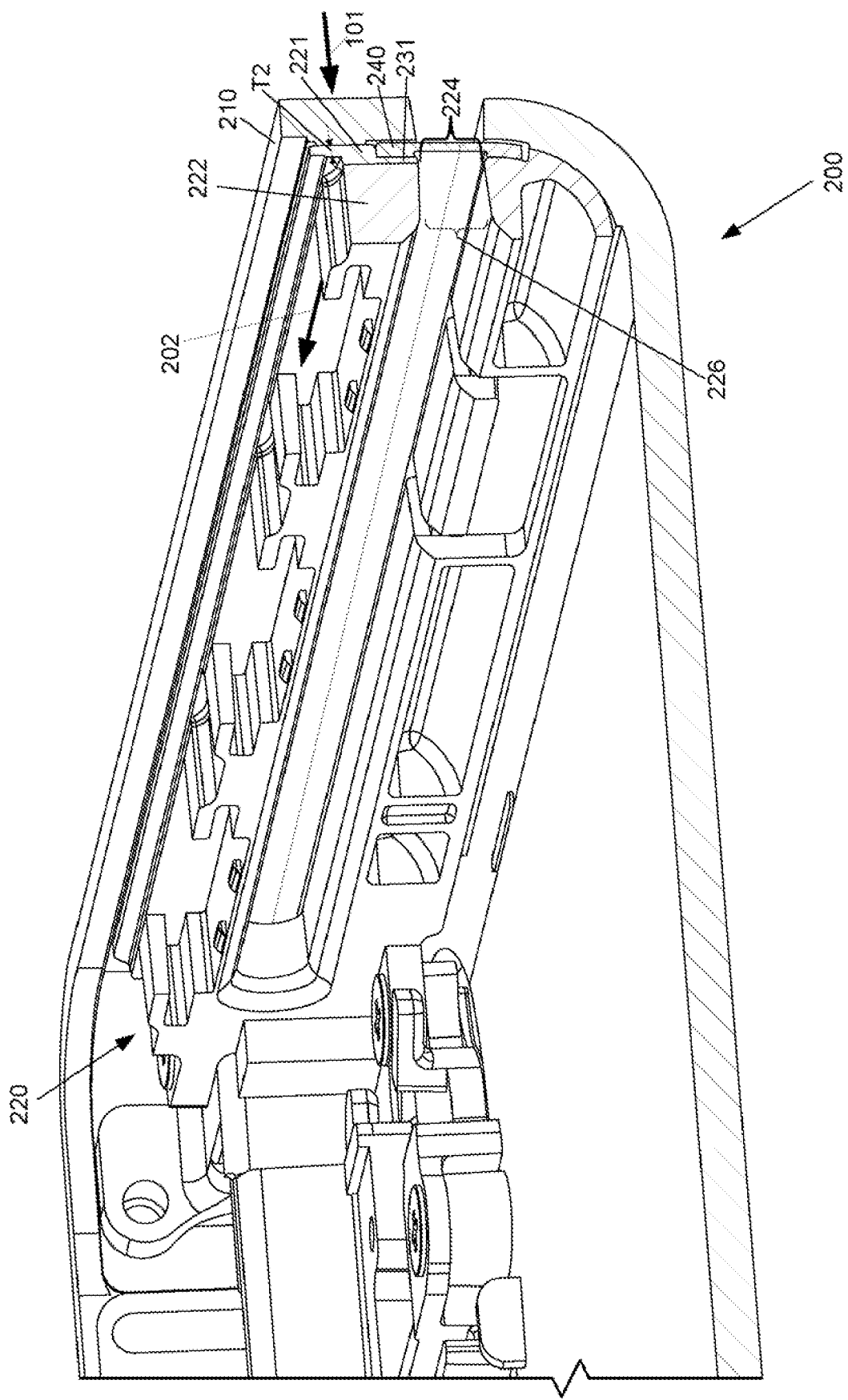
FIG. 2 illustrates a partial cross-sectional view of an electronic device in accordance with one or more embodiments of the present invention.

FIG. 2 illustrates a partial cross-sectional view of an electronic device 200 in accordance with one or more embodiments of the present invention. As illustrated in the example of FIG. 2, electronic device 200 may include a first component (e.g., an enclosure 210) and a metal-ceramic composite component/part 221 coupled to enclosure 210. Metal-ceramic composite component 221 may be configured to support enclosure 210 in a first direction 101, such that enclosure 210 may not be deformed or damaged when a force in direction 101 is applied thereon. Metal-ceramic composite component 210 may have a greater strength in first direction 101 than in a second direction, such as direction 202.

Metal-ceramic composite component 221 may be made of a metal-ceramic composite material or metal-ceramic matrix composite containing at least one of aluminum, magnesium, and titanium. The metal-ceramic (matrix) composite material may have a low density and a high strength, and may provide metal surfaces, anodization possibilities, and mold-casting manufacturability, discussed below.

The metal-ceramic (matrix) composite material may generally have a higher strength and only a slightly higher density than aluminum. Accordingly, referring to the examples illustrated in FIGS. 1-2, for providing a support to enclosure 210 that is equivalent to the support provided to enclosure 110 by disk drive bezel 120 in first direction 101, thickness T2 of metal-ceramic composite component 221 may be less than thickness T1 of disk drive bezel 120. Advantageously, with the reduction in thickness, the size and the weight of electronic device 200 may be reduced with respect to electronic device 100. If thickness T2 is equal to thickness T1, electronic device 200 may have a higher strength/durability than electronic device 100.

The metal-ceramic (matrix) composite material may also have metal surfaces. Accordingly, metal-ceramic composite component 221 may be resistant to scratches and may provide a smooth, comfortable feel. In addition, the ceramic constituent under the metal surfaces may provide a high dent resistance. Further, metal-ceramic composite component 221 may have a metal surface that may be bonded with another metal surface utilizing one or more of metal-to-metal bonding techniques that are well known in the art.

The metal-ceramic (matrix) composite material may also provide anodization possibilities on the metal surfaces. Therefore, one or more surfaces of metal-ceramic composite component 221 may be colored through anodization, for example, for aesthetic considerations and/or material/parts management purposes.

The metal-ceramic (matrix) composite material may also provide manufacturability for casting, such as mold casting, which may be less expensive than machining. Accordingly, with a relatively low cost, metal-ceramic composite component 221 may be manufactured utilizing mold casting to include three-dimensional features/configurations for accommodating and/or matching one or more other components of electronic device 200, or for providing functions in addition to supporting enclosure 210.

For example, metal-ceramic composite component 221 may represent at least part of one of a disk drive bezel 220 (e.g., an optical disk drive bezel), a memory card bezel, a connector, etc. and may include a cast feature, such as mold-cast feature 231, configured to match at least a portion of a second component of the electronic device 200. In an example, the second component may represent a shutter 240 through which a storage medium (e.g., an optical disk or a memory card) may enter and exit electronic device 200. Alternatively or additionally, at least a portion of shutter 240 may be inserted between at least a portion of metal-ceramic composite component 221 and at least a portion of enclosure 210. Metal-ceramic composite component 221 may be configured to secure shutter 240 in place with respect to enclosure 210.

Further, for example, metal-ceramic composite component 221 may be configured to provide opening 224 for receiving an object (e.g., an optical disk, a memory card, or a connector) that is inserted into electronic device 200. The object may be inserted into electronic device 200 in first direction.

In another example, metal-ceramic composite component 221 may represent at least part of a user interface component, such as one or more of a coin turn, a track pad, and a button. For example, the coin turn may include a coin slot manufactured utilizing casting, such as mold casting. The coin turn may provide support to the portion of an electronic device enclosure that surrounds the coin turn.

Electronic device 200 may further include a structural component 222 coupled to the metal-ceramic composite component 221. Metal-ceramic composite component 221 may be disposed between structural component 222 and at least a portion of enclosure 210. Further, metal-ceramic composite component 221 may be bonded to structural component 222 by an adhesive, such as DP810 available from 3M Company (www.3m.com).

Structural component 222 also may include an opening 226 configured to receive the object that is inserted into the electronic device in first direction 101. For example, structural component 222 also may represent at least part of one of a disk drive bezel 220 (e.g., an optical disk drive bezel), a memory card bezel, a connector, etc.

As can be appreciated from the foregoing, embodiments of the present invention may simultaneously satisfy strength, weight, size, cost, aesthetic/cosmetic, and tactile requirements and expectations in manufacturing electronic devices. Advantageously, embodiments of the invention may provide strength, durability, feel, and scratch resistance comparable or superior to the benefits provided by metals, as well as low cost and light weight comparable or superior to benefits provided by plastics.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alternations, permutations, and equivalents as fall within the true spirit and scope of the present invention.

What is claimed is:

1. An electronic device comprising:
an enclosure; and
a metal-ceramic composite component made of a metal-ceramic composite material containing at least a metal material and a ceramic material, coupled to a portion of an inner wall of the enclosure, and configured to reinforce at least a portion of the enclosure in a first direction, wherein the metal-ceramic composite component has a greater strength in the first direction than in a second direction and wherein the metal-ceramic composite component is configured to provide an opening for receiving an object that is inserted into the electronic device in the first direction.

2. The electronic device of claim 1 wherein the metal-ceramic composite material contains at least one of aluminum and magnesium.

3. The electronic device of claim 1 wherein the metal-ceramic composite component is made of a metal-ceramic matrix composite.

4. The electronic device of claim 1 wherein the metal-ceramic composite component has a metal surface.

5. The electronic device of claim 1 wherein at least a surface of the metal-ceramic composite component is anodized.

6. The electronic device of claim 1 wherein at least a surface of the metal-ceramic composite component is colored through anodization.

7. The electronic device of claim 1 wherein the metal-ceramic composite component represents at least part of at least one of a disk drive bezel a memory card bezel, and a connector.

8. The electronic device of claim 1 wherein the metal-ceramic composite component represents at least part of a user interface component.

9. The electronic device of claim 1 further comprising a second component, wherein the metal-ceramic composite component includes a cast feature configured to match at least a portion of the second component.

10. The electronic device of claim 1 further comprising a second component, wherein at least a portion of the second component is inserted between at least a portion of the metal-ceramic composite component and at least a portion of the first component.

11. The electronic device of claim 1 further comprising a structural component coupled to the metal-ceramic composite component.

12. The electronic device of claim 11 wherein the metal-ceramic composite component is disposed between at least a portion of the structural component and at least a portion of the first component.

13. The electronic device of claim 11 wherein the metal-ceramic composite component is bonded to the structural component by an adhesive.

14. The electronic device of claim 11 wherein the structural component includes an opening configured to receive an object that is inserted into the electronic device in the first direction.

15. The electronic device of claim 11 wherein the structural component represents at least part of at least one of a disk drive bezel, a memory card bezel, and a connector.

16. A structural component configured for use in an electronic device, the structural component comprising a first part, wherein the first part is made of a metal-ceramic composite material and is configured to reinforce an enclosure of the electronic device in a first direction, wherein the first part is coupled to an inner wall of the enclosure and wherein the first part has a greater strength in the first direction than in a second direction and wherein the first part is configured to provide an opening for receiving an object that is inserted into the opening in the first direction.

17. The structural component of claim 16 representing at least part of at least one of a disk drive bezel, a memory card bezel, and a connector.

18. The structural component of claim 16 wherein the first part is further configured to secure a member of the electronic device in place with respect to the enclosure of the electronic device.

* * * * *

UNITED STATES PATENT AND TRADEMARK OFFICE
CERTIFICATE OF CORRECTION

| | | |
|---|---|---|
| PATENT NO. | : 7,911,771 B2 | Page 1 of 1 |
| APPLICATION NO. | : 11/752850 | |
| DATED | : March 22, 2011 | |
| INVENTOR(S) | : John DiFonzo et al. | |

It is certified that error appears in the above-identified patent and that said Letters Patent is hereby corrected as shown below:

Title page 2, in column 2, under "Other Publications", line 17, delete "Dowloaded" and insert -- Downloaded --, therefor.

In column 1, line 64, delete "300" and insert -- 100 --, therefor.

In column 6, line 19, in claim 7, delete "bezel" and insert -- bezel, --, therefor.

Signed and Sealed this
Twenty-ninth Day of November, 2011

David J. Kappos
*Director of the United States Patent and Trademark Office*